(12) United States Patent
Tseng

(10) Patent No.: US 6,468,862 B1
(45) Date of Patent: Oct. 22, 2002

(54) HIGH CAPACITIVE-COUPLING RATIO OF STACKED-GATE FLASH MEMORY HAVING HIGH MECHANICAL STRENGTH FLOATING GATE

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/990,156

(22) Filed: Nov. 20, 2001

(51) Int. Cl.[7] ............................................... H01L 21/8247
(52) U.S. Cl. ........................ 438/259; 438/260; 438/595
(58) Field of Search ................................. 438/259, 260, 438/261, 264, 296, 589, 595, 657

(56) References Cited

U.S. PATENT DOCUMENTS

| | | | |
|---|---|---|---|
| 5,763,309 A | * | 6/1998 | Chang ......................... 438/296 |
| 5,923,974 A | * | 7/1999 | Liang et al. ................. 438/260 |
| 6,413,809 B2 | * | 7/2002 | Nakamura et al. ........... 438/296 |
| 6,413,818 B1 | * | 7/2002 | Huang et al. ................ 438/270 |

* cited by examiner

Primary Examiner—Chandra Chaudhari
(74) Attorney, Agent, or Firm—J.C. Patents

(57) ABSTRACT

A structure of a stacked gate of a flash memory cell and a method for forming the same is disclosed. A semiconductor substrate having a first conductive gate structure, wherein the first gate conductive structure is disposed in between two neighboring raised shallow trench isolation structures, the dielectric pillar disposed on the sidewall of the first gate conductive structure having a top surface level higher than a top surface of the first gate conductive structure, formed thereon. A conformal conductive layer is formed over the said structure. The conductive layer is patterned to form a second gate conductive structure. The first and the second gate conductive structures forms a floating gate. Next, a thin dielectric layer is formed over the floating gate structure, then another conductive layer is formed over the dielectric layer, and the said conductive layer is patterned to form a control gate.

15 Claims, 5 Drawing Sheets

HIGH CAPACITIVE-COUPLING RATIO OF STACKED-GATE FLASH MEMORY HAVING HIGH MECHANICAL STRENGTH FLOATING GATE

BACKGROUND OF THE INVENTION

1. Field of Invention

The present invention relates generally to semiconductor and more specifically to a structure of a stacked flash memory and a method for manufacturing the same.

2. Description of Related Art

Recently, high-density flash memories have been receiving much attention for application in many fields. One of the most important factors is the low cost and size reduction of each flash memory cell. However, it is very hard to shrink the cell size in the fabrication of a conventional flash memory cell, because a local oxidation of silicon (LOCOS) isolation technique is usually used isolating the flash memory cells. However the most frequently encountered deficiency in the prior art techniques is commonly known as the bird's beak problem, wherein the field oxide expands laterally to consume some of the usable active area. The bird's beak creates stress and defects in the silicon in the active areas. Additional problems routinely encountered with known field oxide formation processes include stress induced dislocations at the edges of the active regions, and the presence of a relatively non-planar surface in or adjacent the fully formed field oxide. The non-planar recesses or notches at the edges of the active regions often degrade subsequently formed gate oxide, which can trap conductive layer residuals creating short circuit paths. Solutions to theses problems have been proposed, but routinely involve relatively complex or dimensionally critical fabrication sequences which are costly to proactive or degrade the semiconductor chip yield. Therefore the LOCOS isolation structure not only limits the integration of the flash memory cells but is also a reliability concern.

However another isolation technique called shallow trench isolation (STI) has been proven to overcome the deficiencies of the aforementioned LOCOS isolation structure and to further increase the integration of a flash memory device with higher device reliability. However, one problem is, the coupling ratio of the cell decreases as the size of the cell becomes smaller. The decrease is because the capacitor surface area between the floating gate and the control gate in the cell is also reduced. Consequently a high negative and a high positive voltage are required to erase data in flash memory cells. The high negative voltage is applied to the gate of the flash cell and the high positive voltage is applied to the source. The drain is usually left floating. This requires that both a positive pump circuit and a negative pump circuit exist on the flash memory chip if the flash memory cells are to be erased after assembly. There are several problems that must be handled when two pump circuits of opposite polarity are on the same chip. Besides increase in chip power, considerable protection circuitry and guarding methodology are required to isolate the pump circuitry and avoid device breakdown. A high operating voltage makes any dimensional reduction of the flash memory cell very difficult. On the other hand, for a flash memory cell having a high coupling ratio, the electric field necessary to initiate an F-N tunneling is high, thereby slowing the tunneling speed of electrons from the floating gate to the source/drain region. The effect slows down the speed of a read or a write operation in the flash memory.

Therefore, it is highly desirable to reduce the flash memory cell size and at the same time the flash memory device has a high erasing and writing capability. Further, it is also highly desirable to improve the mechanical strength of the flash memory cells so that the reliability of the flash memory cells can be substantially increased. Furthermore, it is also highly desirable to design a simple, effective and reliable fabrication method for manufacturing the flash memory cells so that the yield can be increased, whereby the manufacturing cost can be substantially reduced.

SUMMARY OF THE INVENTION

The present invention provides a simple and effective method for reducing the size of a non-volatile flash memory structure so that the integration of the flash memory device can be substantially increased.

The present invention provides a simple and effective method for manufacturing a flash memory, whereby the capacitor surface area between the floating gate and the control gate is increased. Therefore the operating speed of the flash memory can be substantially increased.

The present invention provides a simple and effective method for manufacturing a flash memory structure, whereby the mechanical strength of the flash memory structure is increased. Therefore the reliability of the flash memory can be further increased.

To achieve these and other objects, and in view of its purposes, the present invention is directed to a flash memory structure and a method of manufacturing the same. The method includes sequentially forming a tunneling dielectric layer, and a first conductive layer over a substrate. A photoresist pattern is formed over the first conductive layer. The first conductive layer, the tunneling dielectric layer and the substrate are etched with the photoresist pattern serving as an etching mask to form a shallow trench. An insulating layer is formed over the substrate, wherein the insulating layer fills the shallow trench to form a raised shallow trench isolation (STI) structure. A portion of the insulating layer is selectively removed to expose a portion of the sidewalls of the patterned first conductive layer, as a result a recess is formed over the STI structure. A conformal first dielectric layer is formed over the resulting structure. The first dielectric layer is etched to remove a portion of the first dielectric layer on the top surface of the patterned first conductive layer, and a portion on the top surface of the STI structure. In doing so, a dielectric pillar is formed on each sidewall of the patterned conductive layer. Next, the exposed portion of the patterned first conductive layer is selectively etched to a predetermined depth to form a first gate conductive structure, in doing so, the top surface level of the dielectric pillar is higher than a top surface of the first gate conductive structure. A conformal second conductive layer is formed over the resulting structure. The second conductive layer is patterned to form a second gate conductive structure. The first and the second gate conductive structures together form a floating gate structure. Next, a thin second dielectric layer is formed over the floating gate structure, then a third conductive layer is formed over the second dielectric layer and the third conductive layer is patterned to form a control gate.

Since the first and the second gate conductive structures together forms the floating gate, the capacitor surface area between the floating gate and the control gate is increased. Therefore the capacitive-coupling ratio of the device is increased.

Since the flash memory cells are isolated by STI structures, therefore the LOCOS bird's beak problems can be effectively resolved. Therefore higher level of integration of flash memory devices can be achieved.

It is to be understood by those skilled in the art that the present invention provides a simple and cost effective method for manufacturing a flash memory having a high speed erasing and writing capability.

It is understood that the foregoing general description and the following detailed description are exemplary, but are not restrictive, of the invention.

BRIEF DESCRIPTION OF THE DRAWING

The invention can be more fully understood by reading the following detailed description of the preferred embodiments, with reference made to the accompanying drawings, wherein.

DESCRIPTION OF THE PREFERRED EMBODIMENTS

Figure 1:
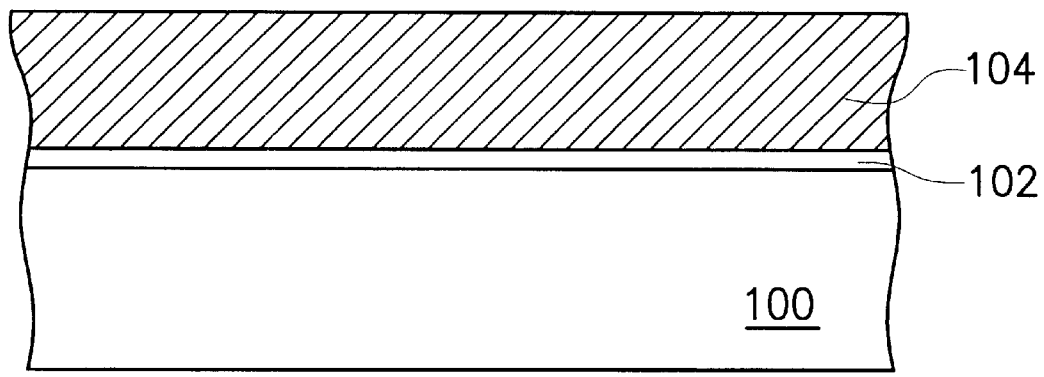
FIGS. 1–10 are cross-sectional views showing the progression of manufacturing steps in the fabrication of a stacked gate flash memory according to one preferred embodiment of this invention.

Reference will be made in detail to the present preferred embodiments of the invention, examples of which are illustrated in the accompanying drawings. Wherever possible, the same reference numbers are used in the drawings and the description to refer to the same or like parts.

It is to be understood that the foregoing general description and the following detailed description are exemplary, and are intended to provide further explanation of the invention as claimed.

Referring to FIG. 1, a substrate 100 is provided. A tunneling oxide layer 102, a conductive layer 104 are sequentially formed over the substrate 100. The tunneling oxide layer 102 is formed by for example, a thermal oxidation process or alternatively, the tunneling oxide layer 102 may be formed by any other deposition techniques well known to persons skilled in the art. The tunneling oxide layer 102 includes for example, a silicon oxide layer. The conductive layer 104 is preferably formed by using a chemical vapor deposition (CVD) method and the doping of the conductive layer 104 is carried out in situ, or alternatively, by any other deposition techniques, known to persons skilled in the art, and carrying out doping of the conductive layer 104 in situ. The thickness of the conductive layer 104 is preferably ranging from about 1,000–4,000 angstroms.

Figure 2:
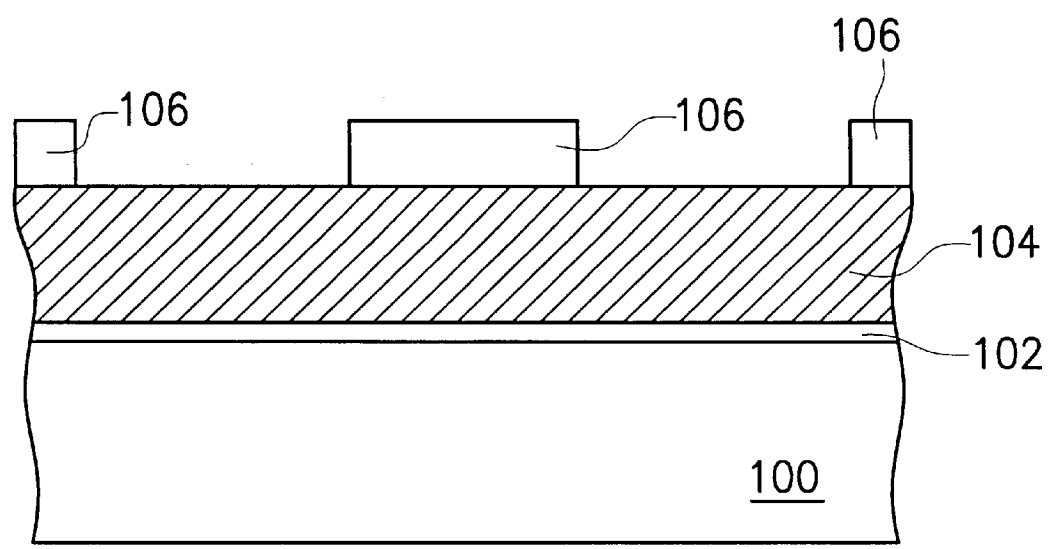

Referring to FIG. 2, a patterned photoresist layer 106 is formed over the conductive layer 104.

Figure 3:
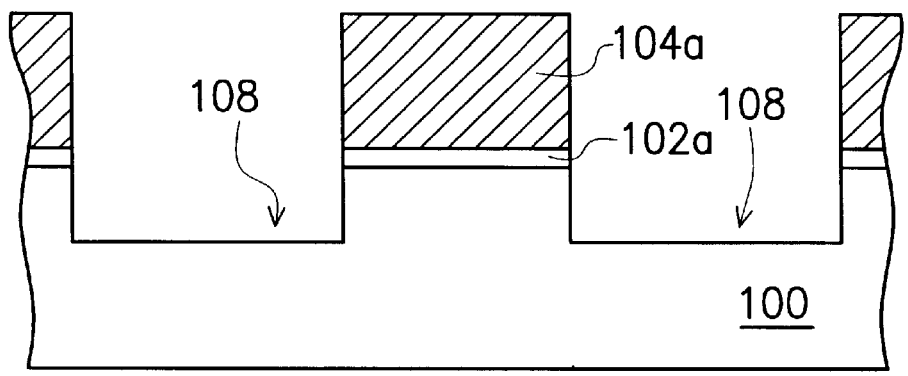

Referring to FIG. 3, using the patterned photoresist layer 106 as a mask, the conductive layer 104, the tunneling oxide layer 102 and the substrate 100 are etched to form a trench 108 in the substrate 100. The etching step is typically performed by a dry etching or a wet etching. The remaining portion of the conductive layer 104 becomes a patterned conductive layer 104a. The patterned photoresist layer 106 is stripped by performing, for example, an anisotropic etching step such as an oxygen plasma ashing process.

Figure 4:
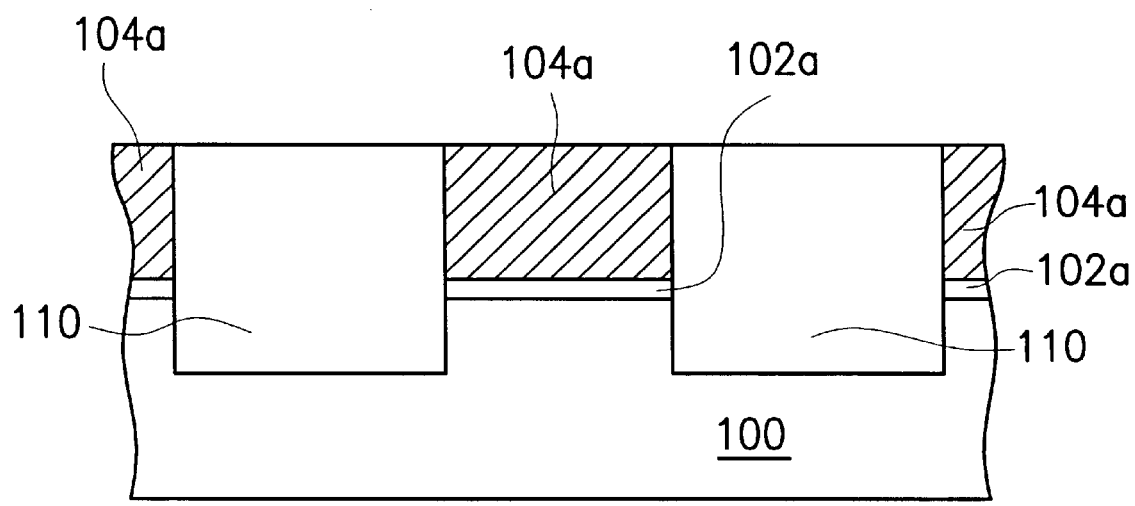

Referring to FIG. 4, an insulating layer is formed over the resulting structure, and thereby fills the trench 108. A chemical mechanical polishing (CMP) process is carried out to planarize the top surface until a top surface of the patterned conductive layer 104a is exposed. As a result, a raised shallow trench isolation (STI) structure 110 is formed. The insulating layer is preferably formed by for example, a CVD method or alternatively, by any other deposition method well known to persons skilled in the art. The insulating layer includes, for example, oxides of silicon.

Figure 5:
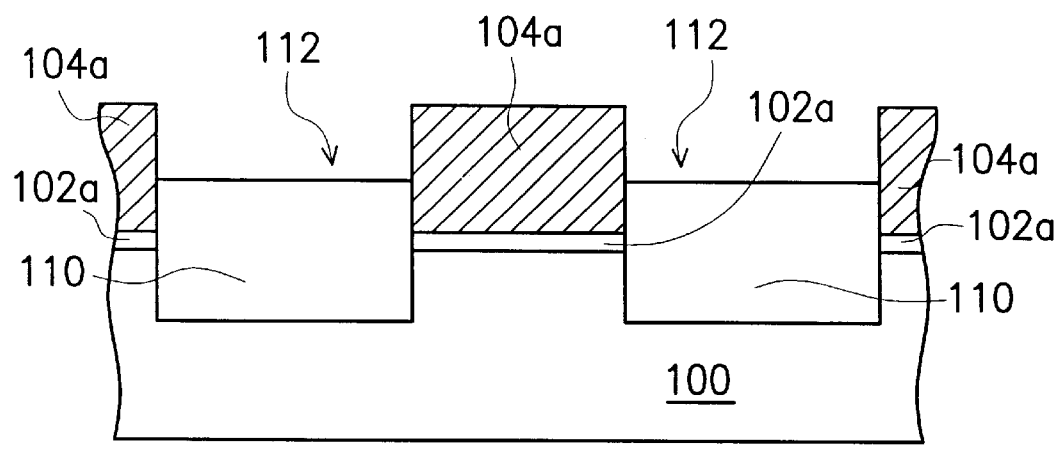

Referring to FIG. 5, the raised STI structure 110 is etched to expose a portion of the sidewall of the patterned conductive layer 104a and to form a recess 112 over the STI structure 110. As a result, the top surface level of the STI structure 110 lies in between a top surface and a bottom surface of the patterned conductive layer 104a. However, the CMP process may be skipped. The recess 112 can alternatively be achieved by only performing the etching back process.

Figure 6:
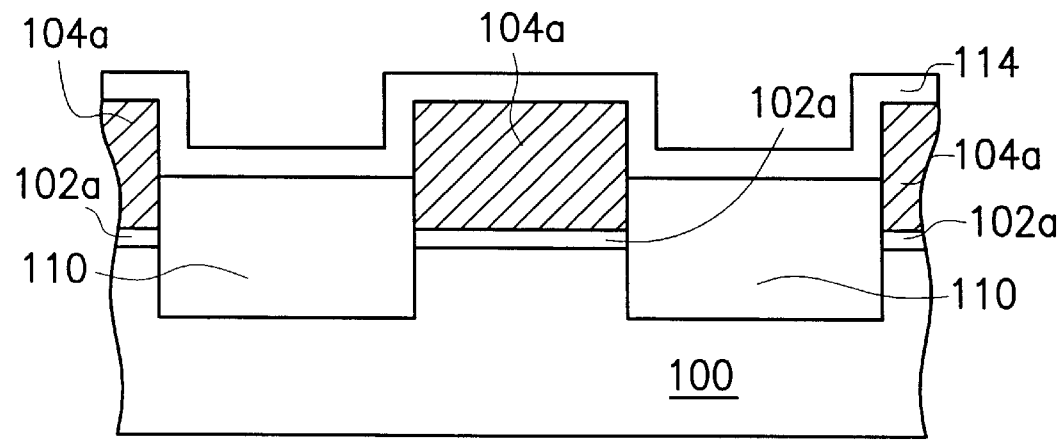

Referring to FIG. 6, next, a conformal dielectric layer 114 is formed over the recess 112 and the exposed portion of the patterned conductive layer 104a. The dielectric layer 114 is preferably formed by using a plasma enhanced chemical vapor deposition (PECVD) method or alternatively by any other deposition methods well known to persons skilled in the art. The material of the dielectric layer 114 preferably include oxides of silicon thereof. The thickness of the dielectric layer 114 is preferably has a range of about 200–2,000 angstroms.

Figure 7:
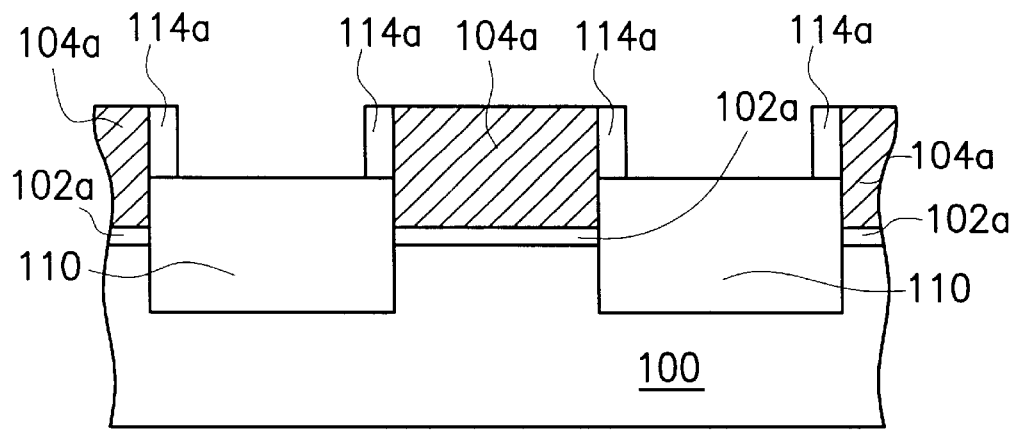

Referring to FIG. 7, a portion of the dielectric layer 114 on the top portion of the patterned conductive layer 104a, and a portion of the dielectric layer 114 on the top surface of the recess 112 are selectively removed, while a portion of the dielectric layer 114 on the sidewalls of the conductive layer 104a is retained.

Figure 8:
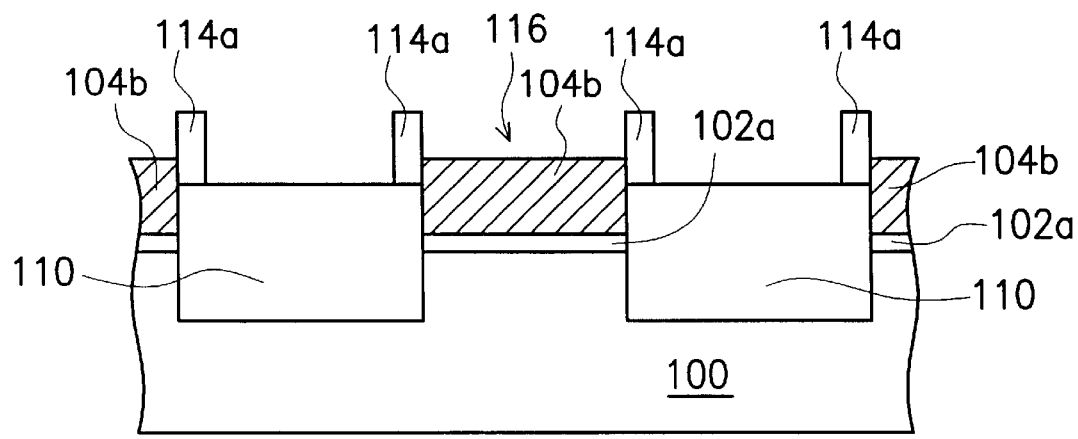

Referring to FIG. 8, the patterned conductive layer 104a (shown in FIG. 7) is selectively etched to a predetermined depth, in doing so, a gate conductive structure 104b, and a dielectric pillar structure 114a on the sidewall of the gate conductive structure 104b are formed. A recess 116 is formed in between the dielectric pillar structures 114a. The etching step is typically performed by a dry etching method.

Figure 9:
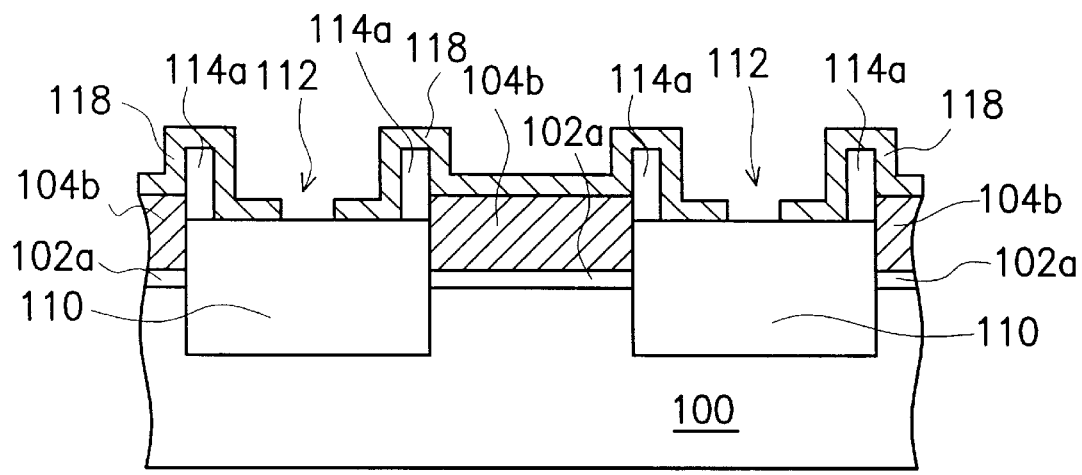

Referring to FIG. 9, a conformal conductive layer is formed over the substrate which is substantially conformal to the recess 112, the dilectric pillar structure 114a and the gate conductive structure 104b. The conductive layer is patterned to form a gate conductive structures 118. The gate conductive structures 104b and 118 together forms a floating gate. The material of the conductive layer includes, for example, an in-situ doped polysilicon. The conductive layer is preferably formed by using a CVD method, or alternatively, by any other deposition techniques, known to persons skilled in the art. The thickness of the conductive layer has a range of about 100–1,000 angstroms.

Figure 10:
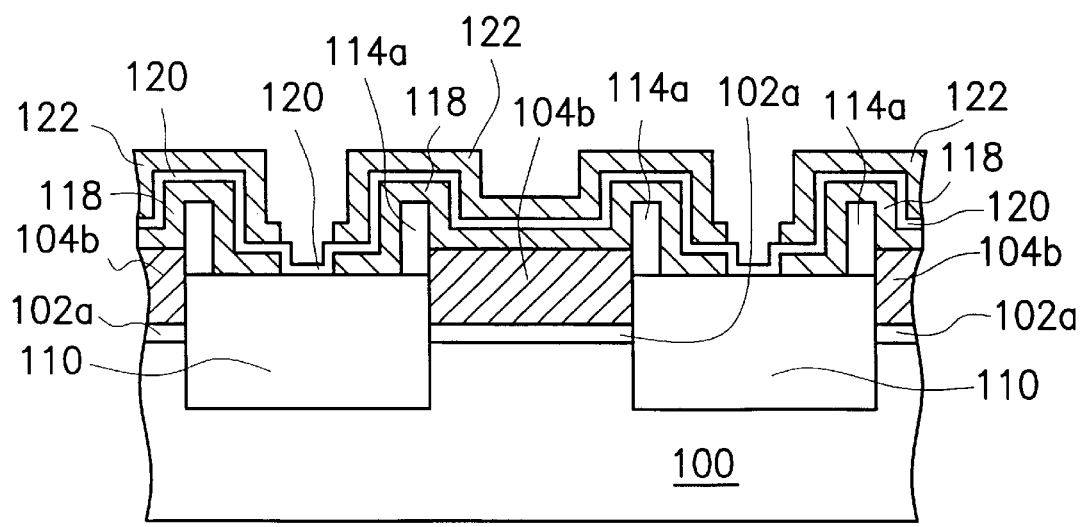

Referring to FIG. 10, a thin dielectric layer 120 is formed over the second gate conductive structure 118. Preferably, the material of the thin dielectric layer 120 is a composite structure comprising for example, nitride-oxide of silicon (NO) and oxide-nitride-oxide (ONO) of silicon. Preferably, the thin dielectric layer 120 is formed by using a chemical vapor deposition (CVD) method or alternatively, by any other techniques well known to persons skilled in the art. Next, a conformal conductive layer is formed over the thin insulating layer 120. The conductive layer is patterned to form a control gate structure 122. Preferably, the conductive layer includes for example, of doped polysilicon layer. The conductive layer is preferably formed by using a CVD method and the doping of the conductive layer is carried out in situ, or alternatively, by any other deposition techniques, known to persons skilled in the art, and carrying out doping of the conductive layer in situ.

A feature of the present invention is the formation of a floating gate comprising dielectric pillars 114a on the sidewalls of the gate conductive structure 104b. Next, forming a gate conductive structure 118 over the insulation pillars and the gate conductive structure 104b. The gate conductive structures 104b and 118 together serves as the floating gate, as a result a floating gate with a larger surface area is formed, this in turn would increase the capacitor area between the floating gate and the control gate. As a result, a flash memory device with higher capacitive-coupling ratio is achieved.

Another feature of the present invention is that the flash memory cells are isolated by raised STI structures instead of the conventional LOCOS field oxide isolation structures, therefore the bird's beak problems can be effectively eliminated. As a result, higher level of integration of flash memory devices can be realized.

It is to be understood by those skilled in the art that the present invention provides a simple and cost effective method for manufacturing a flash memory having a high speed erasing and writing capability.

It is to be further understood by those skilled in the art that because the floating gate having a larger surface area compared to the conventional floating gate structure is formed, therefore the capacitor area between the floating gate and the control gate is increased. Therefore the operating speed of the flash memory device can be effectively increased.

It is to be understood by those skilled in the art that because of the larger surface area of the floating gate, the flash memory device has a high mechanical strength.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method for fabricating a floating gate, the method comprising:
    forming a tunneling dielectric layer on a semiconductor substrate;
    forming a first conductive layer;
    patterning the first conductive layer, the tunneling dielectric layer and the substrate to form a trench, whereby the first conductive layer is patterned to form a conductive structure;
    forming an insulating layer over the substrate, wherein the insulating layer fills the trench;
    removing a portion of the insulating layer to form a raised shallow trench isolation (STI) structure, wherein a portion of sidewalls of the conductive structure is also exposed;
    forming a dielectric layer over the substrate;
    etching back the dielectric layer to form a spacer structure on the exposed portion of the sidewalls of the conductive structure;
    removing a portion of the conductive structure to a predetermined depth to further expose a sidewall of the spacer structure;
    forming a conformal second conductive layer over a topographic surface of the substrate, wherein the second conductive layer has contact with the conductive structure; and
    patterning the second conductive layer, whereby the second conductive layer and the conductive structure serve together as a floating gate.

2. The method of claim 1, wherein the first conductive layer comprises a doped polysilicon, wherein the polysilicon layer is doped in situ.

3. The method of claim 1, wherein a thickness of the first conductive layer has a range of about 1,000–4,000 angstroms.

4. The method of claim 1, wherein the second conductive layer comprises a doped polysilicon, wherein the polysilicon layer is doped in situ.

5. The method of claim 1, wherein a thickness of the second conductive layer has a range of about 100–1,000 angstroms.

6. The method of claim 1, wherein the dielectric layer includes silicon oxide.

7. The method of claim 1, wherein the thickness of the dielectric layer has a range of about 200–2,000 angstroms.

8. A method for fabricating a stacked gate, the method comprising:
    providing a conductive structure isolated by a shallow trench isolation (STI) structure, wherein the STI structure has a surface level between a top surface and a bottom surface of the conductive structure;
    forming a dielectric pillar on a sidewall of the conductive structure;
    etching the conductive structure to a predetermined depth to form a first gate conductive structure;
    forming a conformal first conductive layer over the substrate;
    patterning the first conductive layer to form a second gate conductive structure, wherein the second gate conductive structure extends to the STI structure, and the first and the second gate conductive structures together serves as a floating gate;
    sequentially forming a thin dielectric layer and a second conductive layer over the second gate conductive structure; and
    patterning the second conductive layer to form a control gate.

9. The method of claim 8, wherein the step of forming the dielectric pillar comprises:
    forming a dielectric layer over the conductive structure and the STI structure; and
    selectively etching the dielectric layer to remove a portion of the dielectric layer on the top surface of the conductive structure and a portion of the dielectric layer on the top surface of the STI structure.

10. The method of claim 9, wherein a thickness of the dielectric layer has a range of about 200–2,000 angstroms.

11. The method of claim 8, wherein the dielectric pillar includes silicon oxide.

12. The method of claim 8, wherein the first and the second gate conductive structures include a doped polysilicon.

13. The method of claim 8, wherein the floating gate structure includes a doped polysilicon.

14. The method of claim 8, wherein a thickness of the first gate conductive structure has a range of about 1,000–4,000 angstroms.

15. The method of claim 8, wherein a thickness of the second gate conductive structure has a range of about 100–1,000 angstroms.

* * * * *